(12) United States Patent
Ohnishi (10) Patent No.: US 11,551,767 B2
(45) Date of Patent: Jan. 10, 2023

(54) SEMICONDUCTOR STORAGE DEVICE HAVING BOOSTING CIRCUITS WITH DIFFERENT BOOSTING CAPACITIES

(71) Applicant: KIOXIA CORPORATION, Tokyo (JP)

(72) Inventor: Hidekazu Ohnishi, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 29 days.

(21) Appl. No.: 17/184,253

(22) Filed: Feb. 24, 2021

(65) Prior Publication Data

US 2022/0076764 A1 Mar. 10, 2022

(30) Foreign Application Priority Data

Sep. 9, 2020 (JP) .............................. JP2020-151564

(51) Int. Cl.
*G11C 5/14* (2006.01)
*G11C 16/30* (2006.01)
*G11C 16/04* (2006.01)

(52) U.S. Cl.
CPC .......... *G11C 16/30* (2013.01); *G11C 16/0483* (2013.01)

(58) Field of Classification Search
CPC ...... G11C 16/30; G11C 16/0483; G11C 5/147
USPC ....................................................... 365/226
See application file for complete search history.

(56) References Cited

U.S. PATENT DOCUMENTS

| 6,278,316 | B1 | 8/2001 | Tanzawa et al. | |
|---|---|---|---|---|
| 7,839,689 | B2 * | 11/2010 | Pyeon | G11C 16/30 365/207 |
| 8,031,548 | B2 * | 10/2011 | Jeon | G11C 5/147 365/229 |
| 8,400,829 | B2 | 3/2013 | Chu | |
| 8,400,837 | B2 * | 3/2013 | Edahiro | G11C 11/5642 365/182 |
| 8,755,235 | B2 | 6/2014 | Midorikawa et al. | |
| 9,859,012 | B1 | 1/2018 | Hioka | |
| 10,242,745 | B2 | 3/2019 | Hosoya | |
| 11,335,416 | B1 * | 5/2022 | Sforzin | G11C 16/0483 |
| 2012/0293243 | A1 | 11/2012 | Suzuki | |

FOREIGN PATENT DOCUMENTS

| JP | 3908415 B2 | 4/2007 |
|---|---|---|
| JP | 2011-108349 A | 6/2011 |
| JP | 2012-099177 A | 5/2012 |
| JP | 2012-244660 A | 12/2012 |
| JP | 2018-007355 A | 1/2018 |
| JP | 2018-156718 A | 10/2018 |

* cited by examiner

Primary Examiner — Tha-O H Bui
(74) Attorney, Agent, or Firm — Kim & Stewart LLP (57) ABSTRACT

A semiconductor storage device includes a first boosting circuit, a second boosting circuit, a first driver circuit that is activated when a first output voltage generated by the first boosting circuit is supplied thereto, and a first driver transistor that is controlled by the first driver circuit and coupled between a power supply line and the second boosting circuit.

14 Claims, 7 Drawing Sheets

SEMICONDUCTOR STORAGE DEVICE HAVING BOOSTING CIRCUITS WITH DIFFERENT BOOSTING CAPACITIES

CROSS-REFERENCE TO RELATED APPLICATION

This application is based upon and claims the benefit of priority from Japanese Patent Application No. 2020-151564, filed Sep. 9, 2020, the entire contents of which are incorporated herein by reference.

FIELD

Embodiments described herein relate generally to a semiconductor storage device.

BACKGROUND

A memory system including a NAND-type flash memory and a controller that controls the NAND-type flash memory is known as one example of a semiconductor storage device.

DETAILED DESCRIPTION

Embodiments provide a boosting circuit of a semiconductor storage device with a reduced circuit area.

In general, according to one embodiment, a semiconductor storage device includes a first boosting circuit, a second boosting circuit, a first driver circuit that is activated when a first output voltage generated by the first boosting circuit is supplied thereto, and a first driver transistor that is controlled by the first driver circuit and coupled between a power supply line and the second boosting circuit.

Hereinafter, a nonvolatile semiconductor storage device related to the present embodiment is specifically described with reference to the drawings. In the following description, elements having substantially the same function and configuration are denoted by the same reference numerals, and are described in duplicate only when necessary. Each of the following embodiments provides example devices and methods for embodying the technical idea of the present embodiment. The technical idea of the embodiment is not limited to the specific material, shape, structure, arrangement, and the like described as follows. The technical idea of the embodiment may be obtained by giving various modifications that are within the scope of claims.

In the following description, a signal BZ is an inverted signal of a signal Z. Otherwise, if the signal Z is a control signal, the signal Z has a positive logic level, then the signal BZ has a negative logic level. That is, the "H" level of the signal Z corresponds to assertion, and the "L" level of the signal Z corresponds to negation. The "L" level of the signal BZ corresponds to assertion, and the "H" level of the signal Z corresponds to negation.

In the description of the circuit configuration, if it is expressed that an element A is connected to an element B, the case includes a case where the element A and the element B are directly connected to each other and also includes a case where the element A and the element B are electrically connected to each other. In the latter case, another member may be provided between the element A and the element B.

<First Embodiment>

A semiconductor storage device according to an embodiment is described.

[Configuration of Memory System 1]

A configuration of a memory system including the semiconductor storage device according to the present embodiment is described with reference to FIG. 1.

Figure 1:
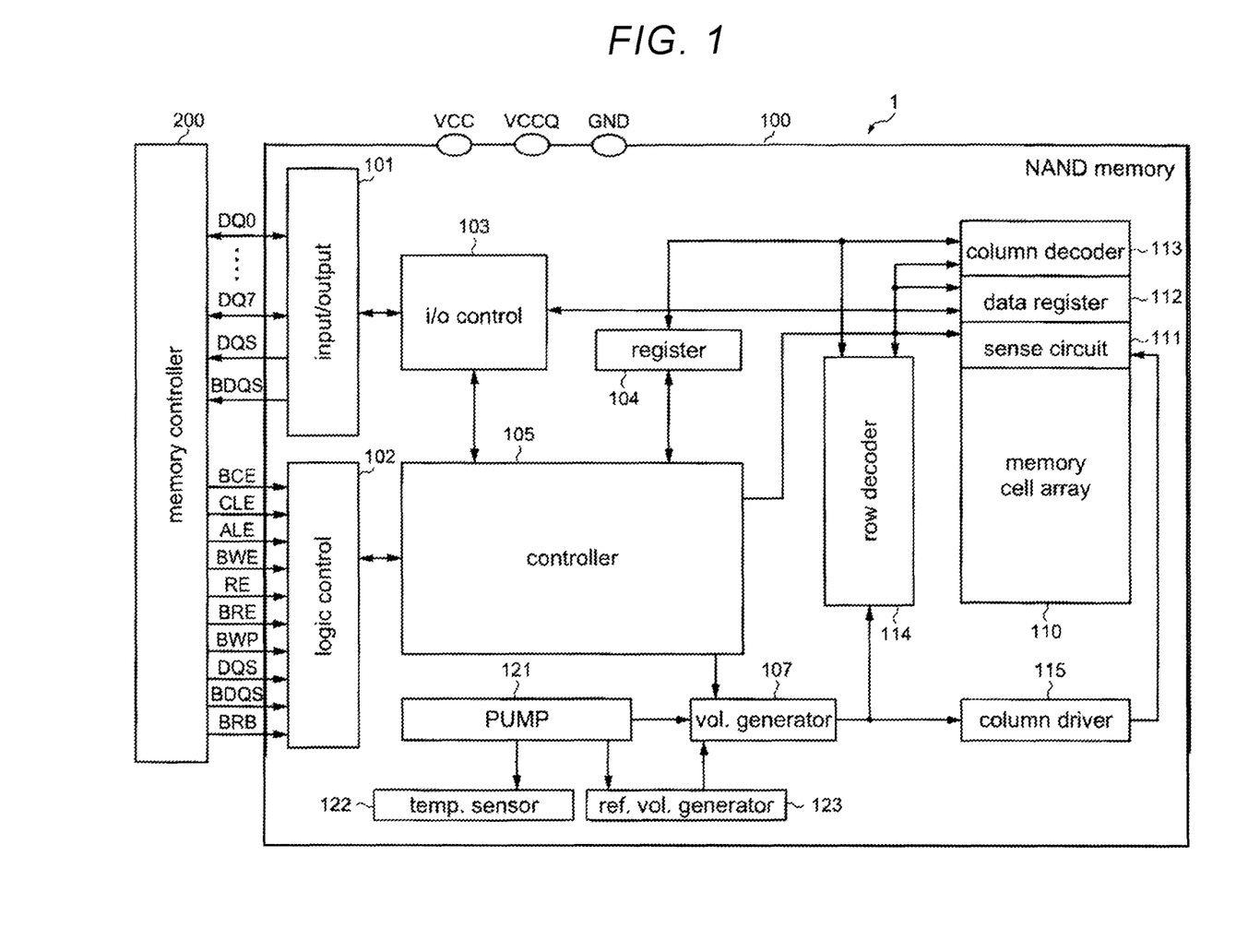
FIG. 1 is a block diagram illustrating a configuration of a memory system according to an embodiment.

As illustrated in FIG. 1, the memory system 1 includes a NAND-type flash memory (more generally, a semiconductor storage device) 100 (NAND memory) and a memory controller 200. For example, the NAND-type flash memory 100 and the memory controller 200 may be combined with each other to configure a semiconductor device, and examples thereof include a memory card such as an SDTM card or a solid state drive (SSD). The memory system 1 may be configured to further include a host device (not illustrated).

[Configuration of Memory Controller 200]

The memory controller 200 outputs a command required for an operation of the NAND-type flash memory 100 or the like to the NAND-type flash memory 100. The memory controller 200 outputs the command to the NAND-type flash memory 100 to read data from the NAND-type flash memory 100, write data to the NAND-type flash memory 100, erase data from the NAND-type flash memory 100, or the like.

[Configuration of NAND-Type Flash Memory 100]

The NAND-type flash memory 100 is connected to the memory controller 200 via an input/output interface 101 (input/output) and a logic control signal input interface 102 (logic control).

The input/output interface 101 generates data strobe signals DQS and BDQS according to a signal supplied from an input/output control circuit 103 (I/O control). The input/output interface 101 outputs the data strobe signals DQS and BDQS when data is output from data input/output lines (DQ0 to DQ7). The memory controller 200 receives data from the data input/output lines (DQ0 to DQ7) according to the timing of the data strobe signals DQS and BDQS.

The input/output interface 101 includes, for example, a command input terminal and an address input terminal.

The logic control signal input interface 102 receives a chip enable signal BCE, a command latch enable signal CLE, an address latch enable signal ALE, a write enable signal BWE, read enable signals RE and BRE, a write protect signal BWP, the data strobe signals DQS and BDQS, and a ready busy signal BRB from the memory controller 200.

The chip enable signal BCE is used as a selection signal of the NAND-type flash memory 100.

The command latch enable signal CLE is a signal used when receiving an operation command into a register 104.

The address latch enable signal ALE is a signal used when receiving address information or input data into the register 104.

The write enable signal BWE is a signal for receiving a command, an address, and data in the input/output interface 101 into the NAND-type flash memory 100.

The read enable signals RE and BRE are signals used when serially outputting data from the input/output interface 101.

When the input signal is unknown, such as when the power is supplied to or cut off from the NAND-type flash memory 100, the write protect signal BWP is used for protecting data from unexpected erasure or writing.

The ready busy signal BRB is a signal indicating an internal operation state of the NAND-type flash memory 100. The ready busy signal BRB is a signal indicating that the NAND-type flash memory 100 is in any one of a state of receiving an instruction from the outside (ready state) or a state of not receiving an instruction from the outside (busy state).

The NAND-type flash memory 100 is provided with a VCCQ pad, a VCC pad, and a GND pad for supplying power for driving the NAND-type flash memory 100 from the outside. A voltage VCCQ supplied to the VCCQ pad is used as a reference voltage for an input/output signal between the memory controller 200 and the NAND-type flash memory 100. A voltage VCC supplied to the VCC pad is used as another reference voltage in the NAND-type flash memory 100. A ground voltage (GND) is supplied to the GND pad, and for example, is defined as the ground (e.g., 0 V) in the memory system 1. In the following description, the VCCQ pad, the VCC pad, and the GND pad are referred to as "external pads."

The input/output control circuit 103 outputs data read from a memory cell array 110 to the memory controller 200 via the input/output interface 101. The input/output control circuit 103 receives various commands such as write, read, erase, and status read commands, address, and write data via the input/output interface 101 and a control circuit 105.

The control circuit 105 supplies the control signal input via the logic control signal input interface 102 to the input/output control circuit 103.

The control circuit 105 controls the register 104, a voltage generation circuit 107 (vol. generator), a sense circuit 111, a data register 112, a column decoder 113, a row decoder 114, a column driver 115, a boost power generation circuit 121 (PUMP), a temperature sensor 122 (temp. sensor), and a reference voltage generation circuit 123 (ref. vol. generator).

The control circuit 105 operates according to a control signal and a command input via the register 104. The control circuit 105 uses the voltage generation circuit 107 when programming, verifying, reading, and erasing data, to supply the desired voltage to the memory cell array 110, the sense circuit 111, and the row decoder 114.

The boost power generation circuit 121 boosts the voltage VCC and supplies the boosted voltage to the voltage generation circuit 107. Details are described below, but a driver circuit that drives a boosting circuit provided in the boost power generation circuit 121 is connected to the temperature sensor 122 and/or the reference voltage generation circuit 123. In other words, the temperature sensor 122 and/or the reference voltage generation circuit 123 is activated by a driver circuit of the boost power generation circuit 121.

The temperature sensor 122 measures a temperature of the NAND-type flash memory 100 based on the instruction of the control circuit 105 and generates a temperature code based on the temperature. The temperature sensor 122 supplies the temperature code to the voltage generation circuit 107. The voltage generation circuit 107 generates the various voltages based on the temperature code. Detailed descriptions of the temperature sensor 122 are provided below. The temperature sensor 122 generates the temperature code before or at the same time of an access operation such as a write operation to the memory cell array 110, a read operation from the memory cell array 110, an erasing operation of the memory cell array 110, or the like. In other words, the temperature sensor 122 is activated before the start of the boost operation of the boost power generation circuit 121 or at the same time of the boost operation.

The reference voltage generation circuit 123 generates the reference voltage used in the NAND-type flash memory 100 based on the instruction of the control circuit 105. The reference voltage generation circuit 123 supplies the reference voltage to the voltage generation circuit 107. The voltage generation circuit 107 generates the various voltages based on the reference voltage. Detailed description of the reference voltage generation circuit 123 is provided below. In the same manner as the temperature sensor 122, the reference voltage generation circuit 123 generates the reference voltage before the access operation such as the write operation to the memory cell array 110, the read operation from the memory cell array 110, and the erasing operation from the memory cell array 110. In other words, the reference voltage generation circuit 123 is activated before the start of the boost operation of the boost power generation circuit 121.

In the present embodiment, the input/output control circuit 103 and the control circuit 105 are described for each function. In other words, the input/output control circuit 103 and the control circuit 105 may be implemented by the same hardware resource.

The register 104 outputs the command input from the input/output control circuit 103 to the control circuit 105.

For example, the register 104 latches the address supplied from the memory controller 200. The register 104 converts the latched address to the internal physical address (column address and row address). The register 104 supplies the column address to the column decoder 113 and supplies the row address to the row decoder 114.

Various statuses inside the NAND-type flash memory 100 are stored in the register 104 for notification. The register 104 includes a ready/busy register that stores data indicating whether the NAND-type flash memory 100 is in any one of the ready state or the busy state and a write status register (not illustrated) that stores data indicating whether the writing succeeds or fails.

The memory cell array 110 includes a plurality of bit lines BL, a plurality of word lines WL, and a plurality of source lines SL. The memory cell array 110 is configured with a plurality of blocks BLK in which electrically rewritable memory cell transistors (simply referred to as memory cells) MC are arranged in a matrix configuration. The memory cell transistor MC includes a stacked gate including, for example, a control gate electrode and a charge storage layer (for example, a floating gate electrode) and stores binary or multi-valued data depending on a change in the transistor threshold voltage determined by the amount of charge injected into the floating gate electrode. The memory cell transistor MC may include a Metal-Oxide-Nitride-Oxide-Silicon (MONOS) structure that traps electrons in the nitride film.

In embodiments, the memory cell array 110 may have other configurations. For example, a configuration of a memory cell array that can be used as memory cell array 110 is disclosed, for example, in U.S. patent application Ser. No. 12/407,403 filed on Mar. 19, 2009, titled "THREE DIMENSIONAL STACKED NONVOLATILE SEMICONDUCTOR MEMORY". Other configurations are disclosed in U.S. patent application Ser. No. 12/406,524 filed on Mar. 18, 2009, titled "THREE DIMENSIONAL STACKED NONVOLATILE SEMICONDUCTOR MEMORY", U.S. patent application Ser. No. 12/679,991 filed on Mar. 25, 2010, titled "NVOLATILE SEMICONDUCTOR MEMORY DEVICE AND METHOD OF MANUFACTURING THE SAME", U.S. patent application Ser. No. 13/816,799 filed on Sep. 22, 2011, titled "NONVOLATILE SEMICONDUCTOR MEMORY DEVICE", and U.S. patent application Ser. No. 12/532,030 filed on Mar. 23, 2009, titled "SEMICONDUCTOR MEMORY AND METHOD FOR MANUFACTURING THE SAME". Each of the aforementioned patent applications in this paragraph is incorporated herein by reference in its entirety.

In an embodiment, the memory cell array 110 can have a configuration as disclosed, for example, in U.S. patent application Ser. No. 12/397,711 filed on Mar. 3, 2009, titled "SEMICONDUCTOR MEMORY DEVICE HAVING PLURALITY OF TYPES OF MEMORIES INTEGRATED ON ONE CHIP". Other configurations are disclosed in U.S. patent application Ser. No. 13/451,185 filed on Apr. 19, 2012, titled "SEMICONDUCTOR MEMORY DEVICE INCLUDING STACKD GATE HAVING CHARGE ACCUMULATION LAYER AND CONTROL GATE AND METHOD OF WRITING DATA TO SEMICONDUCTOR MEMORY DEVICE", U.S. patent application Ser. No. 12/405,626 filed on Mar. 17, 2009, titled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", and U.S. patent application Ser. No. 09/956,986 filed on Sep. 21, 2001, titled "NONVOLATILE SEMICONDUCTOR MEMORY DEVICE HAVING ELEMENT ISOLATING REGION OF TRENCH TYPE AND METHOD OF MANUFACTURING THE SAME". Each of the aforementioned patent applications in this paragraph is incorporated herein by reference in its entirety.

The sense circuit 111 detects data read from the memory cell transistor MC to the bit line during the read operation of the data. The sense circuit 111 amplifies and sends the detected data to the data register 112.

The data register 112 is configured as a static random access memory (SRAM) or the like. The data register 112 stores data supplied from the memory controller 200, a verification result detected by the sense circuit 111, and the like.

The column decoder 113 decodes the column address signal and outputs a selection signal for selecting one of the bit lines BL to the sense circuit 111.

The row decoder 114 decodes a row address signal. The row decoder 114 selects and drives the word lines WL and select gate lines SGD and SGS of the memory cell array 110. FIG. 1 illustrates a configuration where the voltage generated by the voltage generation circuit 107 is supplied to the row decoder 114. The voltage boosted by the boost power generation circuit 121 may be supplied to the row decoder 114 without the voltage generation circuit 107.

The column driver 115 drives a transistor provided in the sense circuit 111. FIG. 1 illustrates a configuration in which the voltage generated by the voltage generation circuit 107 is supplied to the column driver 115, but the voltage boosted by the boost power generation circuit 121 may be supplied to the column driver 115 without the voltage generation circuit 107.

[Configuration of Boost Power Generation Circuit 121]

Figure 2:
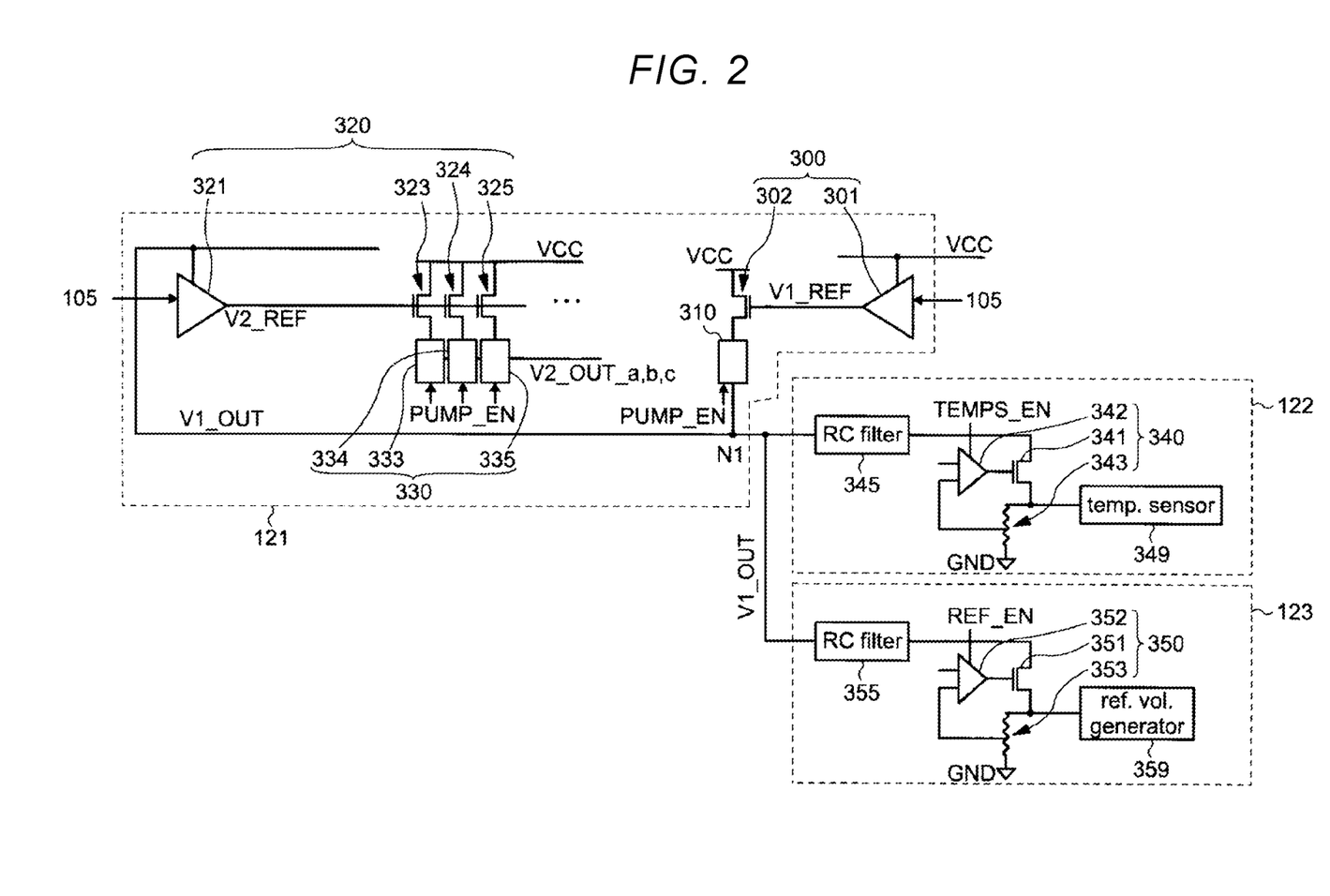
FIG. 2 is a block diagram illustrating a configuration of a boost power generation circuit and other peripheral circuits according to the embodiment.

With reference to FIG. 2, the configuration of the boost power generation circuit 121 is described. As illustrated in FIG. 2, the boost power generation circuit 121 includes a driver circuit 300, a boosting circuit 310, a driver circuit 320, and a boosting circuit 330. In the following description, the boosting circuit 310 may be referred to as a "first boosting circuit." The boosting circuit 330 may be referred to as a "second boosting circuit." The driver circuit 300 is a circuit for supplying a power supply voltage to the boosting circuit 310.

The driver circuit 300 includes a driver 301 and a driver transistor 302. The driver 301 and the driver transistor 302 are connected to a power supply line to which a power supply VCC is supplied. The driver 301 is controlled by the control circuit 105. The output terminal of the driver 301 is connected to the gate terminal of the driver transistor 302. The power supply VCC is supplied from the outside of the NAND-type flash memory 100 via the VCC pad. Therefore, it can say that the voltage VCC supplied from the external pad (e.g., the VCC pad) is supplied to the gate terminal of the driver transistor 302. The driver transistor 302 is provided between the power supply line and the boosting circuit 310. The driver transistor 302 is controlled by a start-up voltage V1_REF output from the driver 301. In the following description, the driver transistor 302 may be referred to as a "second driver transistor."

The driver transistor 302 is a "depletion type" N-type transistor. That is, the driver transistor 302 is a transistor in which there are carriers in a channel even if Vgs (a voltage of a gate terminal with respect to a source terminal) is 0 V, and current flows between the source terminal and the drain terminal. That is, in the depletion type N-type transistor, if the same voltage as the power supply VCC is applied as Vgs, voltage drop due to the threshold voltage of the transistor seldom occurs at the source terminal of the transistor, and almost the same voltage as the power supply VCC is supplied.

The boosting circuit 310 is controlled by a control signal PUMP_EN. The output of the boosting circuit 310 is connected to a node N1. The node N1 is connected to the driver circuit 320, the temperature sensor 122, and the reference voltage generation circuit 123. If the boost operation of the boosting circuit 310 is activated by the control signal PUMP_EN, the boosting circuit 310 outputs an output voltage V1_OUT to the node N1. The output voltage V1_OUT is supplied to the driver circuit 320, the temperature sensor 122, and the reference voltage generation circuit 123.

The temperature sensor 122 and the reference voltage generation circuit 123 are circuits that operate independently from a driver 321, driver transistors 323, 324, and 325, and the boosting circuit 330. In the following description, the temperature sensor 122 and the reference voltage generation circuit 123 may be referred to as "other circuits." The "other circuits" are not limited to the temperature sensor 122 and the reference voltage generation circuit 123 and may include circuits other than the above circuits to which the output voltage V1_OUT output from the boosting circuit 310 is supplied.

In the present embodiment, the configuration in which the output of the boosting circuit 310 is connected to both of the temperature sensor 122 and the reference voltage generation circuit 123 is described, but the output of the boosting circuit 310 may be connected to either of the temperature sensor 122 or the reference voltage generation circuit 123.

The driver circuit 320 includes the driver 321 and the driver transistors 323, 324, and 325. The power supply terminal of the driver 321 is connected to the output terminal of the boosting circuit 310. The driver 321 is controlled by the control circuit 105. The output terminal of the driver 321 is connected to each gate terminal of the driver transistors 323, 324, and 325. In the following description, the driver 321 may be referred to as a "first driver." The driver transistors 323, 324, and 325 may be referred to as "first driver transistors."

The output voltage V1_OUT generated by the boosting circuit 310 is input to the power supply terminal of the driver 321. The driver 321 is driven by the output voltage V1_OUT. A start-up voltage V2_REF is output from the output terminal of the driver 321 to each of the driver transistors 323, 324, and 325.

Each of the driver transistors 323, 324, and 325 is connected to the power supply line to which the power supply VCC is supplied. The driver transistors 323, 324, and 325 are connected to the boosting circuits 333, 334, and 335, respectively. That is, a driver transistor 323 is provided, for example, between the boosting circuit 333 and the power supply line.

The driver transistors 323, 324, and 325 are controlled by the driver 321. In other words, each gate terminal of the driver transistors 323, 324, and 325 is connected to the output terminal of the driver 321. The start-up voltage V2_REF generated from the output voltage V1_OUT is supplied to the gate terminal.

The driver transistors 323, 324, and 325 are "enhancement type" N-type transistors. That is, if Vgs is 0 V, the driver transistor 323 is a transistor in which there are no carriers in the channel, and the current between the source terminal and the drain terminal is cut off. That is, in the enhancement type N-type transistor, if the same voltage as the power supply VCC is applied as Vgs, the voltage resulting from the voltage drop in the power supply VCC according to the threshold voltage of the transistor is supplied to the source terminal of the transistor.

In the depletion type N-type transistor, the voltage supplied to the source terminal when the same voltage as the power supply VCC is applied as Vgs is larger than the voltage supplied to the source terminal when the same voltage as the power supply VCC is applied to Vgs in the enhancement type N-type transistor.

The enhancement type transistor has greater transconductance Gm than the depletion type transistor. Therefore, in order to obtain the same output, the W length of the enhancement type transistor (e.g., the width in a direction orthogonal to the direction connecting the source electrode and the drain electrode to each other) can be reduced more than the W length of the depletion type transistor. As a result, by using the enhancement type transistor as the driver transistor of the boosting circuit as described above, the circuit area of the boosting circuit is reduced compared with the case of using the depletion type transistor as the driver transistor. Since the enhancement type transistor has higher threshold voltage than the depletion type transistor, a higher voltage than the power supply VCC (for example, voltage boosted by the boosting circuit) is required for driving.

In the present embodiment, the driver transistor 302 is a depletion type transistor, and the driver transistors 323, 324, and 325 are enhancement type transistors. Each of transistors 302, 323, 324, and 325 are N types. However, the threshold voltage of the driver transistor 302 is smaller than the threshold voltages of the driver transistors 323, 324, and 325. In other words, when 0 V is supplied to the gate terminal of the driver transistors 323, 324, and 325, the current flowing thereto is smaller than the current flowing to the driver transistor 302 when 0 V is supplied to the gate terminal of the driver transistor 302.

The boosting circuit 330 is controlled by the control signal PUMP_EN. The output terminal of the boosting circuit 330 is connected to the corresponding circuit. If the boost operation of the boosting circuit 330 is activated by the control signal PUMP_EN, the boosting circuits 333, 334, and 335 provide output voltages V2_OUT_a, V2_OUT_b, V2_OUT_c, respectively.

[Configuration of Temperature Sensor 122]

The temperature sensor 122 includes a regulator 340, an RC filter 345, and a temperature sensor unit 349. The output voltage V1_OUT output from the boosting circuit 310 is input to the regulator 340 via the RC filter 345 and converted to the constant voltage. The regulator 340 includes a transistor 341, an error amplifier 342, and a resistor divider 343. The error amplifier 342 controls by a control signal TEMPS_EN. The output voltage is divided by the resistor divider 343 to be compared with the reference signal of the error amplifier 342.

[Configuration of Reference Voltage Generation Circuit 123]

The reference voltage generation circuit 123 includes a regulator 350, an RC filter 355, and a voltage generation unit 359. The output voltage V1_OUT output from the boosting circuit 310 is input to the regulator 350 via the RC filter 355 and is converted to the constant voltage. The regulator 350 includes a transistor 351, an error amplifier 352, and a resistor divider 353. The error amplifier 352 is controlled by a control signal REF_EN. In the same manner as the resistor divider 343, the output voltage is divided by the resistor divider 353 to be compared with the reference signal of the error amplifier 352.

[Operations of Boost Power Generation Circuit 121, Temperature Sensor 122, and Reference Voltage Generation Circuit 123]

Figure 3:
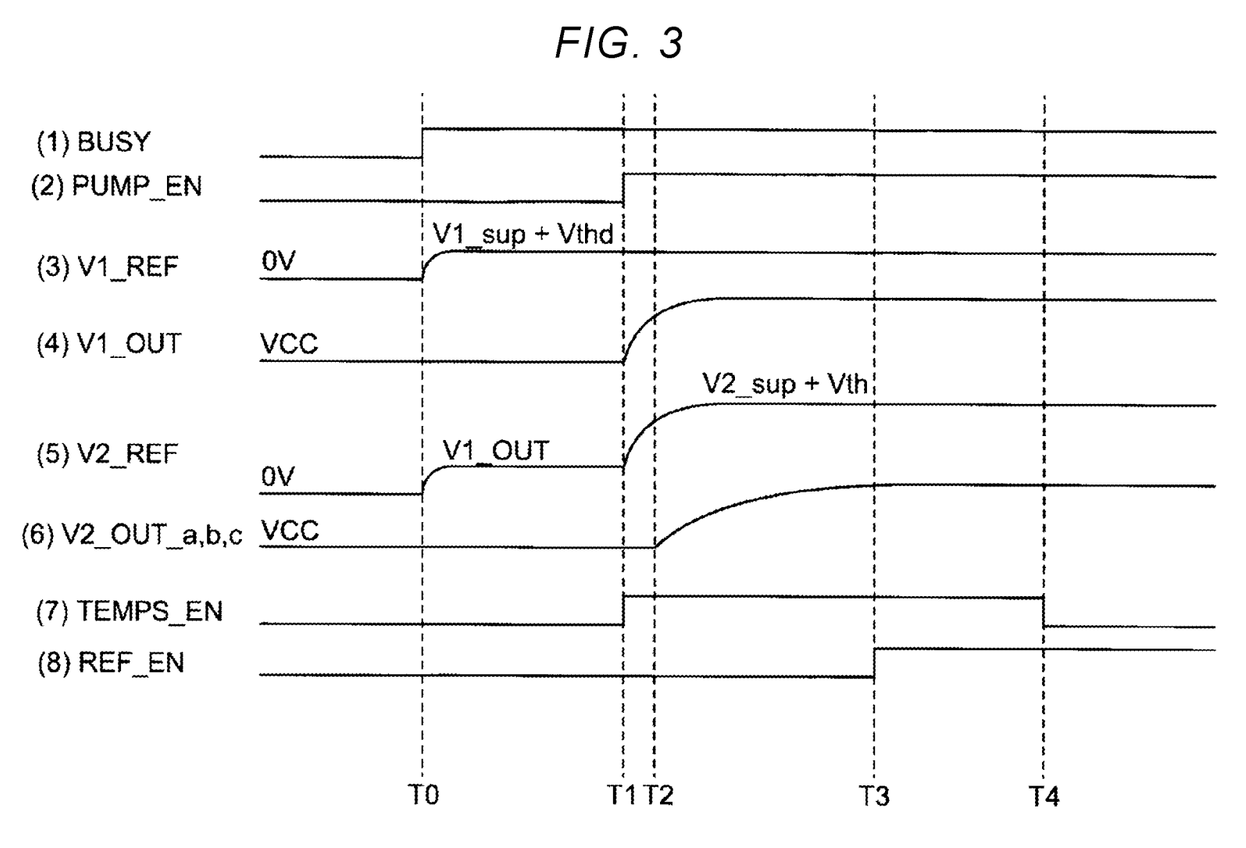
FIG. 3 is a timing chart illustrating an operation of the boost power generation circuit according to the embodiment.

With reference to FIGS. 2 and 3, operations of the boost power generation circuit 121, the temperature sensor 122, and the reference voltage generation circuit 123 are described.

"(1) BUSY" of FIG. 3 is a signal indicating whether the NAND-type flash memory 100 is in the ready state (low status) or the busy state (high status). If an operation command is input to the NAND-type flash memory 100 at time T0, "(1) BUSY" transitions to the high status, and thus the status of the NAND-type flash memory 100 becomes the busy state.

"(2) PUMP_EN" is a control signal for controlling operations of the boosting circuit 310 and the boosting circuit 330. If "(2) PUMP_EN" is in the low status, the boosting circuit 310 and the boosting circuit 330 do not operate, and the reset voltage VCC is output from these boosting circuits. If "(2) PUMP_EN" is in the high status, the boosting circuit 310 and the boosting circuit 330 are activated, and voltages boosted by these boosting circuits are output.

"(3) V1_REF" is a voltage output from the driver 301 based on the control signal from the control circuit 105. "(3) V1_REF" is the voltage for driving the driver transistor 302.

"(4) V1_OUT" is a voltage output from the boosting circuit 310. As described above, the boost operation of the boosting circuit 310 is activated by the switching of "(2) PUMP_EN" from the low status to the high status, which causes the voltage of "(4) V1_OUT" to increase. A voltage rises when the voltage is switched from the low status to the high status as described above. On the other hand, a voltage drops when the voltage is switched from the high status to the low status.

"(5) V2_REF" is a voltage output from the driver 321 based on the control signal from the control circuit 105. "(5) V2_REF" is the voltage for driving each of the driver transistors 323, 324, and 325.

"(6) V2_OUT_a,b,c" is a voltage output from the boosting circuit 330. As described above, the boost operation of the boosting circuit 330 is activated by the rising of "(2) PUMP_EN", which causes the voltage of "(6) V2_OUT_a, b,c" to increase. The voltage output from the boosting circuit 333 is V2_OUT_a, the voltage output from the boosting circuit 334 is V2_OUT_b, and the voltage output from the boosting circuit 335 is V2_OUT_c. The output voltages V2_OUT_a, V2_OUT_b, and V2_OUT_c are different voltages, but these output voltages are collectively referred to as "(6) V2_OUT_a,b,c".

"(7) TEMPS_EN" is a control signal for controlling an operation of the temperature sensor 122. If "(7) TEMPS_EN" is in the low status, the signal that does not drive the transistor 341 is output from the error amplifier 342. If "(7) TEMPS_EN" is in the high status, the transistor 341 is driven by the output signal from the error amplifier 342, and the power supply voltage is supplied by the temperature sensor unit 349.

"(8) REF_EN" is a control signal for controlling the operation of the reference voltage generation circuit 123. If "(8) REF_EN" is in the low status, the signal that does not drive the transistor 351 is output from the error amplifier 352. If "(8) REF_EN" is in the high status, the transistor 351 is driven by the output signal from the error amplifier 352, and the power supply voltage is supplied to the voltage generation unit 359.

As illustrated in FIG. 3, if "(1) BUSY" is in the high status at the time T0, the control signal for activating the driver transistor 302 is input from the control circuit 105 to the driver 301, and the control signal for activating the driver transistors 323, 324, and 325 is input from the control circuit 105 to the driver 321 in the same manner.

The driver 301 supplies the voltage for driving the driver transistor 302 to gate terminal of the driver transistor 302 based on the control signal from the control circuit 105. That is, "(3) V1_REF" starts to gradually increase from a predetermined voltage at the time T0 and is stabilized at V1_sup+Vthd. FIG. 3 illustrates an example in which the start-up voltage V1_REF is 0 V at the time T0. Here, V1_sup is the clamp voltage. Vthd is the threshold voltage of the driver transistor 302 which is the depletion type transistor.

The driver 321 supplies the voltages for driving the driver transistors 323, 324, and 325 to the gate terminals of each driver transistor based on the control signal from the control circuit 105. That is, "(5) V2_REF" starts to gradually increase from a predetermined voltage at the time T0. FIG. 3 illustrates an example in which the start-up voltage V2_REF is 0 V at the time T0. Here, since V1_OUT is input to the power supply terminal of the driver 321, and V1_OUT is lower than the target set voltage, "(5) V2_REF" is stabilized at V1_OUT. The target set voltage is, for example, a desired power supply voltage supplied by the driver transistor 323 to the boosting circuit 334 (e.g., voltage supplied to the start-up voltage V2_REF).

At the time T0, since "(2) PUMP_EN" is in the low status, the boosting circuit 310 is not activated. Therefore, the reset voltage VCC is supplied to "(4) V1_OUT" output from the boosting circuit 310 before or after the time T0. That is, the voltage VCC is supplied to "(5) V2_REF" after the time T0 as V1_OUT.

"(2) PUMP_EN" and "(7) TEMPS_EN" rise in order to activate the temperature sensor 122 at time T1. The driver transistor 302 is a depletion type transistor and thus can be driven at the voltage VCC. Therefore, the boost operation of the boosting circuit 310 starts at the time T1. At the start of the boost operation of the boosting circuit 310, "(4) V1_OUT" gradually increases from the voltage VCC at the time T1. The temperature sensor 122 operates by the output voltage V1_OUT boosted in this manner.

At the time T1, "(5) V2_REF" starts to increase according to the increase of the output voltage V1_OUT to reach V2_sup+Vth, which is the target set voltage. Here, V2 sup is the clamp voltage. Vth is the threshold voltage of the driver transistors 323, 324, and 325 that are enhancement type transistors. The driver transistors 323, 324, and 325 are enhancement type transistors, and thus the start-up voltage V2_REF does not exceed each threshold voltage of the driver transistors 323, 324, and 325 at the time T1. At time T2, if the voltage of "(5) V2_REF" exceeds the threshold voltage of the driver transistors 323, 324, and 325, the driver transistors 323, 324, and 325 are driven, and the boosting circuits 333, 334, and 335 connected to each of the transistors start up. As a result, "(6) V2_OUT_a,b,c" gradually increases from the voltage VCC at the time T2. In this manner, the output voltage V2_OUT_a,b,c is output from the boosting circuits 333, 334, and 335.

As described above, the boosting circuit 310 is activated at the time T1, and the boosting circuit 330 is activated at the time T2. That is, the boosting circuit 310 is activated earlier than the boosting circuit 330.

"(8) REF_EN" for activating the reference voltage generation circuit 123 rises at the time T3. At the time T3, since the boosting circuit 310 is already activated, the reference voltage generation circuit 123 activates at the same time of the switching of the control signal REF_EN. At time T4, "(7) TEMPS_EN" drops, but "(2) PUMP_EN" maintains at the high status, and thus the reference voltage generation circuit 123 continuously operates.

In FIG. 3, "(3) V1_REF" and "(5) V2_REF" start to rise at the same time of the rising of "(1) BUSY". However, after the rising of "(1) BUSY", "(3) V1_REF" and "(5) V2_REF" may rise after delay for a certain period of time.

In the same manner, in FIG. 3, "(4) V1_OUT" and "(5) V2_REF" rise at the same time of the rising of "(2) PUMP_EN". However, after the rising of "(2) PUMP_EN", "(4) V1_OUT" and "(5) V2_REF" may rise after delay for a certain period of time.

As described above, if the enhancement type transistors are used as the driver transistors 323, 324, and 325 respectively provided in the boosting circuit 330, the boosting circuit 330 is activated by using the boosting circuit 310 for activating the other circuits (in the example of FIG. 2, the temperature sensor 122 and/or the reference voltage generation circuit 123) different from the boosting circuit 330. The boosting circuit 310 functions as a start-up circuit (starter) common to the boosting circuit 330 and the temperature sensor 122 (and/or the reference voltage generation circuit 123).

The area of the boosting circuit 310 is smaller than each area of the boosting circuits 333, 334, and 335. The boosting capacity of the boosting circuit 310 is lower than each boosting capacity of the boosting circuits 333, 334, and 335.

In the above example, although the signal "(7) TEMPS_EN" rises together with the signal "(2)

PUMP_EN", the rising of both signals may not be identical. Otherwise, instead of the signal "(7) TEMPS_EN" or at the same time of the signal "(7) TEMPS_EN", the signal "(8) REF_EN" may rise. The signal "(2) PUMP_EN" may rise earlier than the signal "(7) TEMPS_EN".

[Circuit Diagram of Boost Power Generation Circuit 121]

Figure 4:
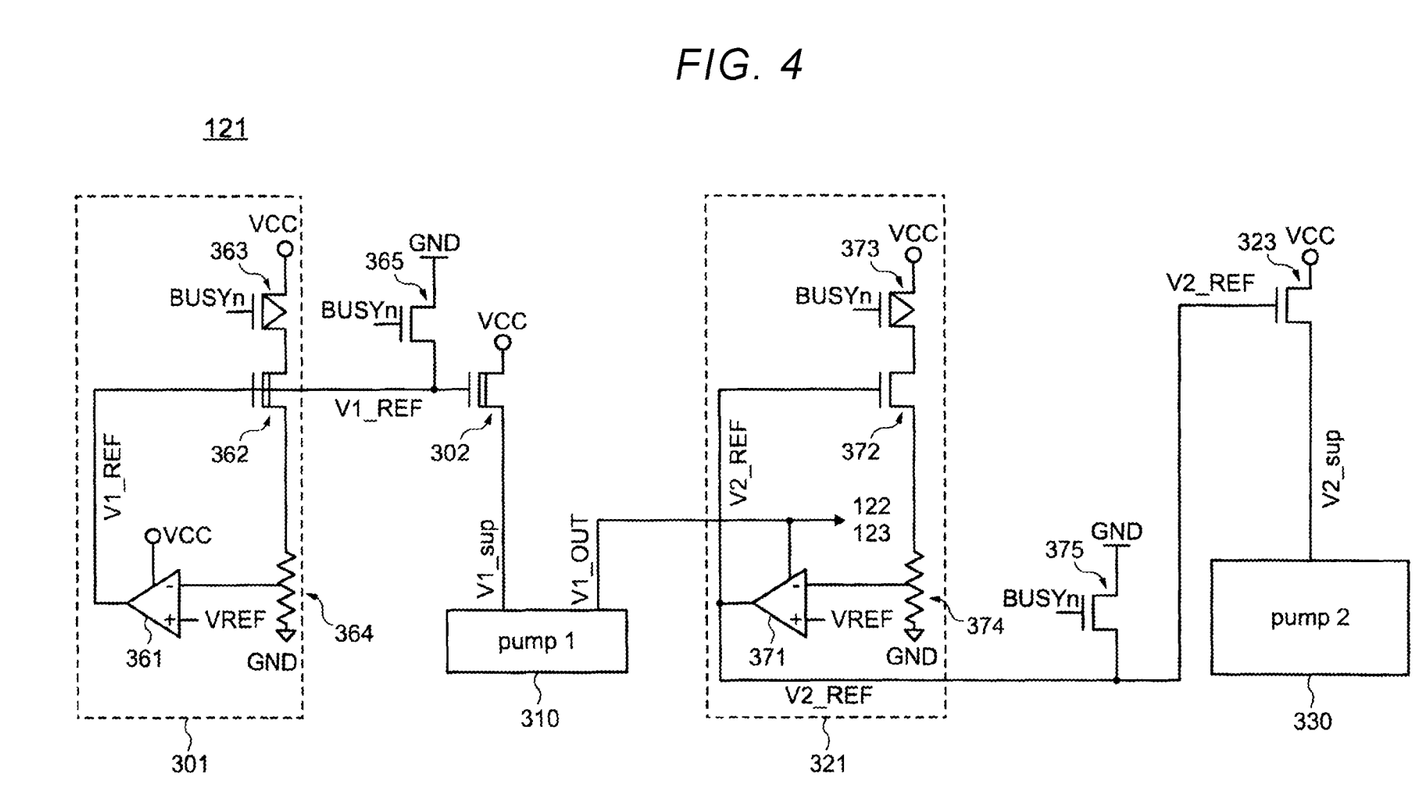
FIG. 4 is a circuit diagram illustrating the configuration the boost power generation circuit according to the embodiment.

An embodiment of the circuit diagram of the boost power generation circuit 121 is described in FIG. 4. The circuit diagrams of the driver 301 and the driver 321 illustrated in FIG. 4 are detailed circuit diagrams of the driver 301 and the driver 321 of FIG. 2, respectively.

As illustrated in FIG. 4, the driver 301 includes an operational amplifier 361, a transistor 362, a transistor 363, and a resistor divider 364. The voltage VCC is input to the power supply terminal of the operational amplifier 361, a reference voltage VREF is input to the first input terminal, and the second input terminal is connected to the resistor divider 364. Specifically, the resistor divider 364 is two or more resistor elements connected to each other in series, and the second input terminal is connected to the intermediate node of the resistor element connected in series. The output terminal of the operational amplifier 361 is connected to the gate terminal of the transistor 362 and the gate terminal of the driver transistor 302. The transistor 363 is provided between the transistor 362 and the power supply line to which the voltage VCC is supplied. The resistor divider 364 is provided between the transistor 362 and the GND.

The transistor 362 is an N-type and depletion type transistor in the same manner as the driver transistor 302. The transistor 363 is the P type transistor. The start-up voltage V1_REF output from the output terminal of the operational amplifier 361 is supplied to the gate terminal of the transistor 362 and the gate terminal of the driver transistor 302. The output voltage is divided for comparison with the reference signal of the operational amplifier 361 by the resistor divider 364. The voltage VCC is supplied to the transistor 363, and a control signal BUSYn (inverted signal of BUSY) is supplied from the control circuit 105 to the gate terminal of the transistor 363. The enhancement type transistor may be used as the transistor 363.

The driver 301 operates a control signal BUSY from the control circuit 105 as a trigger. The driver transistor 302 also transitions to the ON status according to the operation of the driver 301. If the driver transistor 302 transitions to the ON status, the voltage V1_sup is supplied to the boosting circuit 310.

A reset transistor 365 is provided between the gate terminal of the driver transistor 302 and the GND. The reset transistor 365 is an N-type transistor. The control signal BUSYn is supplied to the gate terminal of the reset transistor 365. The enhancement type transistor is used as the reset transistor 365.

The output voltage V1_OUT output from the boosting circuit 310 is supplied to the driver 321.

The driver 321 includes an operational amplifier 371, a transistor 372, a transistor 373, and a resistor divider 374. The output voltage V1_OUT is input to the power supply terminal of the operational amplifier 371, the reference voltage VREF is input to the first input terminal, and the second input terminal is connected to the resistor divider 374. Specifically, the resistor divider 374 includes two or more resistor elements connected in series, and the second input terminal is connected to the intermediate node of the resistor element connected in series. The output terminal of the operational amplifier 371 is connected to the gate terminal of the transistor 372 and the gate terminal of the driver transistor 323. The enable transistor 373 is provided between the transistor 372 and the power supply line to which the VCC is supplied. The resistor divider 374 is provided between the transistor 372 and the GND.

The transistor 372 is an N-type and enhancement type transistor in the same manner as the driver transistor 323. The transistor 373 is a P type transistor. The start-up voltage V2_REF output from the output terminal of the operational amplifier 371 is supplied to the gate terminal of the transistor 372 and the gate terminal of the driver transistor 323. The output voltage is divided by the resistor divider 374 for comparison with the reference signal of the operational amplifier 371. The voltage VCC is supplied to the transistor 373, the control signal BUSYn from the control circuit 105 is supplied to the gate terminal of the transistor 373. An enhancement type transistor may be used as the transistor 373.

The driver 321 operates the control signal BUSY from the control circuit 105 as a trigger. The driver transistor 323 also transitions to the ON status according to the operation of the driver 321. Since the driver transistor 323 transitions to the ON status, the voltage V2_sup is supplied to the boosting circuit 330.

The output voltage V1_OUT is input to the power supply terminal of the operational amplifier 371. Accordingly, if the driver 321 operates by the output voltage V1_OUT, the start-up voltage V2_REF sufficient for driving the enhancement type transistor 372 is supplied to the gate terminal of the transistor 372.

A reset transistor 375 is provided between the gate terminal of the driver transistor 323 and the GND. The reset transistor 375 is an N-type transistor. The control signal BUSYn is supplied to the gate terminal of the reset transistor 375. An enhancement type transistor is used as the reset transistor 375.

[Circuit Diagram of Boosting Circuit 310]

Figure 5:
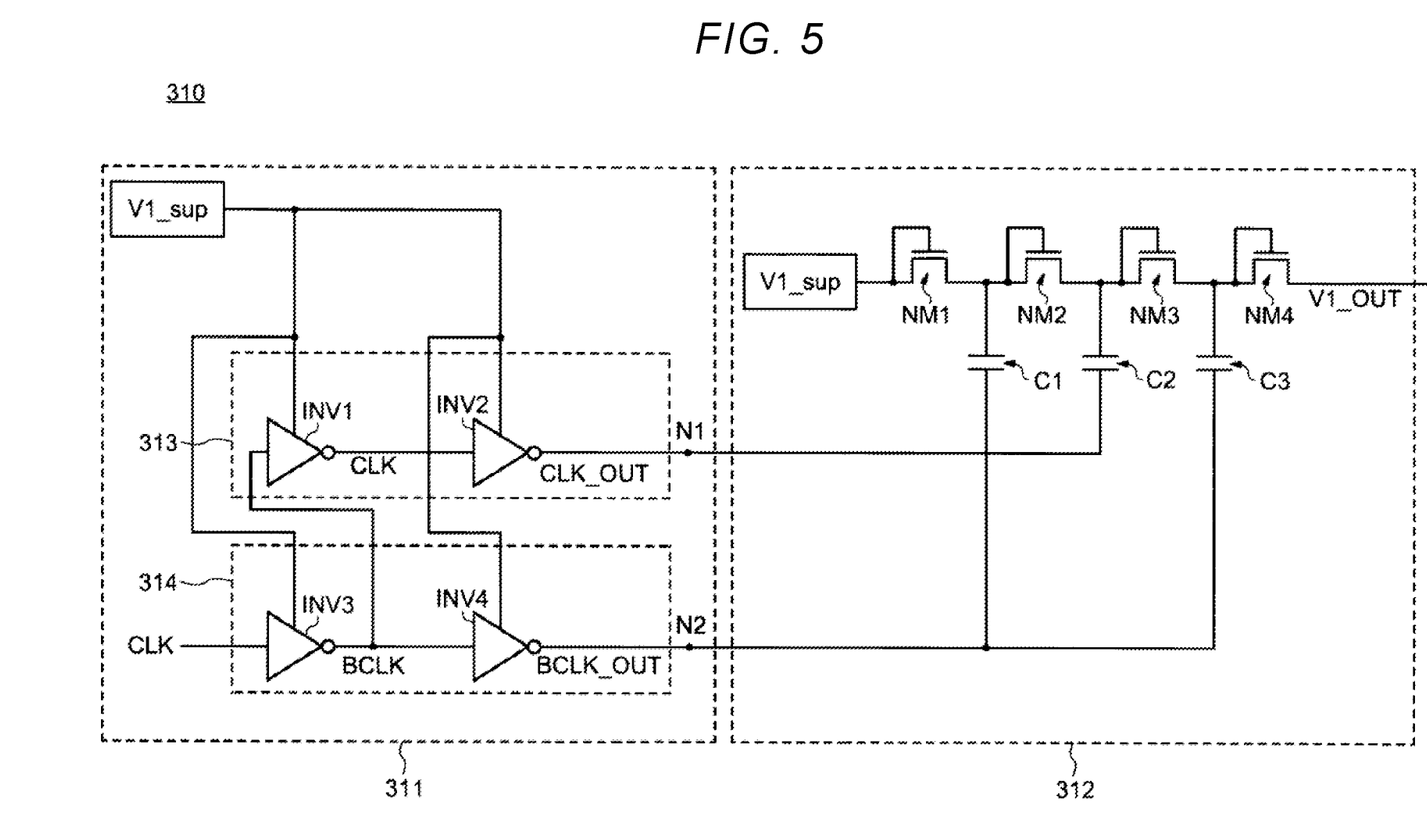
FIG. 5 is a circuit diagram illustrating a configuration of a boosting circuit according to the embodiment.

With reference to FIG. 5, the circuit diagram of the boosting circuit 310 is described. The boosting circuit 310 illustrated in FIG. 5 is an example and does not limit the configuration of the boosting circuit 310 according to the present embodiment. The boosting circuit 330 includes a circuit configuration that is the same as the boosting circuit 310, and thus the description of the boosting circuit 330 is omitted.

As illustrated in FIG. 5, the boosting circuit 310 includes a clock signal generation circuit 311 and a charge pump 312.

The charge pump 312 includes NMOS transistors NM1 to NM4 and capacitors C1 to C3. The numbers of NMOS transistors and capacitors in the charge pump 312 are not limited to that shown in FIG. 5.

The NMOS transistors NM1 to NM4 are diode-connected, and function as diodes. The current paths of the NMOS transistors NM1 to NM4 are sequentially connected in series.

First ends of the capacitors C1 to C3 are electrically connected to first ends of the NMOS transistors NM2 to NM4, respectively. A clock signal CLK_OUT is supplied to a second end of the capacitor C2, a clock signal BCLK_OUT is supplied to second ends of the capacitors C1 and C3. The clock signal BCLK_OUT is an inverted signal of the clock signal CLK_OUT.

The voltage V1_sup is supplied (input) to one end of the NMOS transistor NM1. The capacitors C1 to C3 are clocked by the clock signals CLK_OUT and BCLK_OUT and the input voltage V1_sup is boosted to generate the output voltage V1_OUT larger than the voltage V1_sup. NM1 to NM4 are transfer transistors. In this manner, the output voltage V1_OUT is transferred (output) to the other end of the NMOS transistor NM4.

The clock signal generation circuit 311 includes a clock signal generation circuit 313 and a clock signal generation circuit 314. In the clock signal generation circuit 313, a clock signal BCLK is input, and the clock signal CLK_OUT is output. In the clock signal generation circuit 314, a clock signal CLK is input, and the clock signal BCLK_OUT is output. The clock signal BCLK is an inverted signal of the clock signal CLK.

The clock signal generation circuit 313 includes inverters INV1 and INV2. The clock signal generation circuit 314 includes inverters INV3 and INV4.

The input terminal of the inverter INV1 is electrically connected to the output terminal of the inverter INV3. The clock signal BCLK is supplied to the input terminal of the inverter INV1. The voltage V1_sup is supplied to the power supply terminal of the inverter INV1. The clock signal CLK is output to the output terminal of the inverter INV1.

The input terminal of the inverter INV2 is electrically connected to the output terminal of the inverter INV1. The clock signal CLK is supplied to the input terminal of the inverter INV2. The voltage V1_sup is supplied to the power supply terminal of the inverter INV2. The output terminal of the inverter INV2 is electrically connected to the node N1. The clock signals CLK_OUT is output to the node N1.

The clock signal CLK is supplied to the input terminal of the inverter INV3. The voltage V1_sup is supplied to the power supply terminal of the inverter INV3. The clock signal BCLK is output to the output terminal of the inverter INV3.

The input terminal of the inverter INV4 is electrically connected to the output terminal of the inverter INV3. The clock signal BCLK is supplied to the input terminal of the inverter INV4. The voltage V1_sup is supplied to the power supply terminal of the inverter INV4. The output terminal of the inverter INV4 is electrically connected to a node N2, and the clock signal BCLK_OUT is output to the node N2.

[Circuit Diagram of Block in Memory Cell Array 110]

Figure 6:
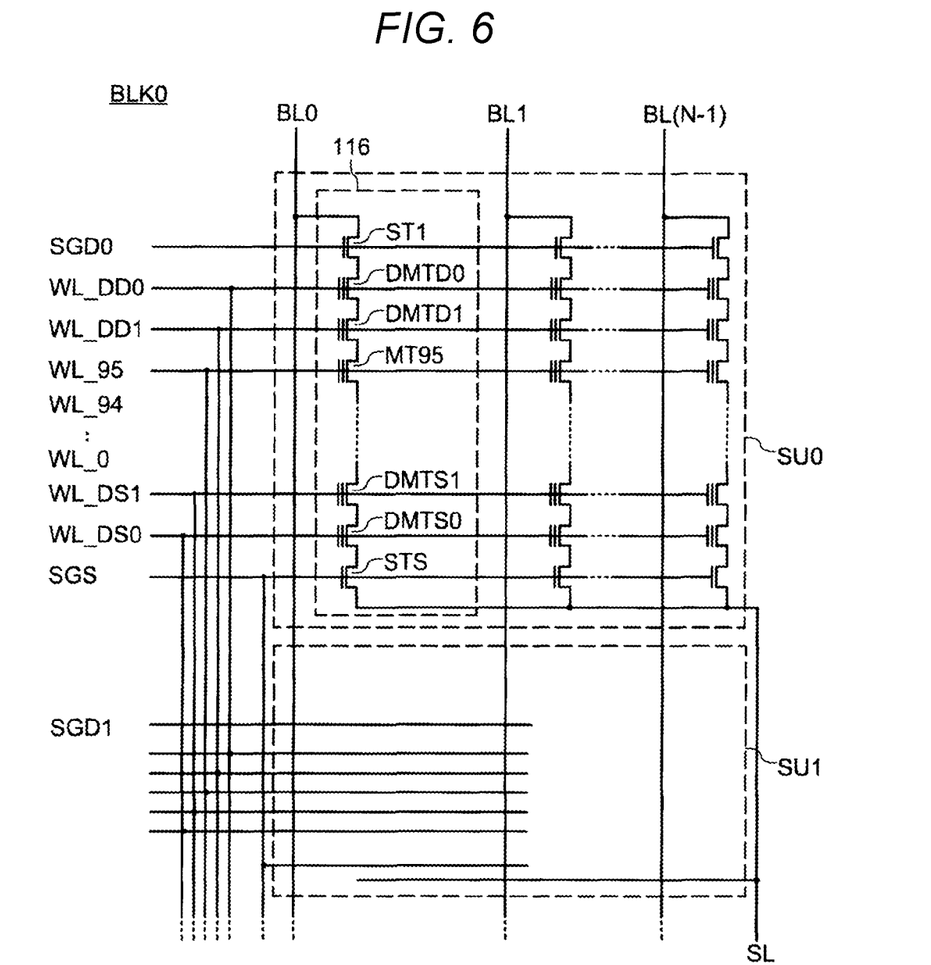
FIG. 6 is a circuit diagram illustrating a configuration of a memory cell of a semiconductor storage device according to the embodiment.

FIG. 6 is a circuit diagram illustrating the blocks BLK in the memory cell array 110 of the NAND-type flash memory 100 related to the present embodiment. The example of the block BLK0 is described, but the other blocks BLK1, 2, and the like are the same circuits. The example of the circuit diagram illustrated in FIG. 6 is an example and does not limit the circuit diagram of the memory cell array 110 of the present embodiment.

The block BLK0 is connected to N items of the bit lines BL (BL0, BL1, . . . , and BL (N–1)). The block BLK0 is connected to the source lines SL. A NAND string 116 is connected between the bit lines BL and the source lines SL. The NAND string 116 has a configuration in which a drain-side select gate transistor ST1, two drain-side dummy cells DMTD (DMTD0 and DMTD1), 96 memory cells MT (MT95 to MT0), two source-side dummy cells DMTS (DMTS1 and DMTS0), and source-side select gate transistors STS are connected in series. String units SU (SU0, SU1) are configured by providing the NAND string 116 to N items of the bit lines BL. In FIG. 6, among the memory cells MT, the memory cell MT95 is only illustrated, and the other memory cells MT94 to 0 are omitted.

The Drain-Side Select Gate Transistor ST1 (corresponding to a lower layer select gate transistor described below) is connected to a drain-side select gate line SGD0. The drain-side dummy cells DMTD (DMTD and DMTD1) are connected to dummy cell word lines WL_DD (WL_DD0 and WL_DD1) corresponding thereto. The 96 memory cells MT (MT95 to MT0) are connected to the word lines WL (WL_95 to WL_0) corresponding thereto. The source-side dummy cells DMTS (DMTS1 and DMTS0) are connected to dummy cell word lines WL_DS (WL_DS1 and WL_DS0) corresponding thereto. The source-side select gate transistors STS are connected to the source-side select gate lines SGS.

[Cross-Sectional View of Memory Cell Array 110]

Figure 7:
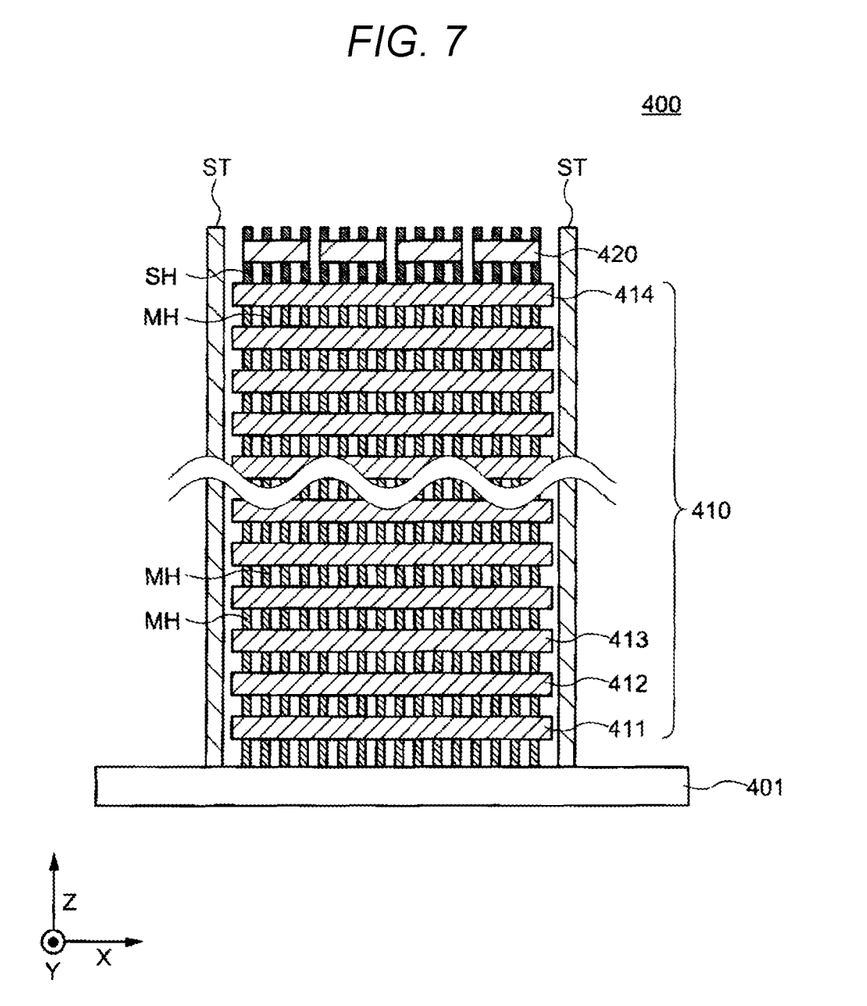
FIG. 7 is a cross-sectional view illustrating a configuration of the memory cell of the semiconductor storage device according to the embodiment.

With respect to FIG. 7, a cross-sectional structure of a stacked body 400 that configures the memory cell array 110 of the NAND-type flash memory 100 according to the present embodiment is described. The cross-sectional view illustrated in FIG. 7 is an example, and does not limit the cross-sectional structure of the memory cell array 110 of the present embodiment.

In the stacked body 400, a memory cell array layer 410 and a drain-side select gate (SGD) layer 420 are stacked from the below on a semiconductor substrate 401 via an insulating film.

The memory cell array layer 410 is a stacked body obtained by alternately stacking a large number of conductive films 411, 412, 413, . . . , and 414 and insulating films. A large number of through via hole (memory holes MH) are formed in the memory cell array layer 410. An insulating film (e.g., a $SiO_2$ film or a SiN film), a charge storage film (e.g., a SiN film), and a gate oxide film (e.g., a $SiO_2$ film) are stacked inside the memory holes MH, from the side walls of the memory holes MH to the inner side, and further a semiconductor film (e.g., a Si film) is buried on the inner side of the gate oxide film. The conductive film 411 positioned on the lowermost layer of the memory cell array layer 410 corresponds to the gate of the source-side select transistor STS. The conductive films 412, 413, . . . , and 414 positioned from the second layer to the uppermost layer of the memory cell array layer 410 correspond to the gates of the memory cells MT and the dummy cells DMT.

The SGD layer 420 is provided over the conductive film 414. A large number of through holes (select transistor holes SH) are formed in the SGD layer 420. An insulating film (e.g., a $SiO_2$ film or a SiN film), a charge storage film (e.g., a SiN film), and a gate oxide film (e.g., a $SiO_2$ film) are stacked inside the select transistor holes SH, in the same manner as the memory holes MH, from the side walls of the select transistor holes SH to the inner side, and a semiconductor film (e.g., a Si film) is further buried inside the gate oxide film. The SGD layer 420 corresponds to the gate of the drain-side select gate transistor ST1.

The stacked body 400 is electrically separated from the adjacent stacked body 400 with a memory slit ST interposed therebetween that vertically penetrates the stacked body 400. The memory slit ST is filled with a conductive pair to form a source line contact that vertically penetrates the stacked body 400. The source line contact configures a portion of the source line SL.

The present embodiments are described above with reference to the drawings, but the present embodiments are not limited to those above and may be appropriately modified without departing from the spirit of the present disclosure. For example, appropriate addition, deletion, or change of design of components based on the NAND-type flash memory of the present embodiment by those skilled in the art are also included in the scope of the present embodiment. Furthermore, each of the above embodiments may be appropriately combined as long as there is no contradiction with each other, and technical matters common to each embodiment are included in each embodiment even if there is no explicit description.

Even if other effects are different from the effects brought about by aspects of the above embodiments, those that are clear from the description of the present specification or that can be easily predicted by those skilled in the art are obviously construed to be brought by the present embodiment.

While certain embodiments have been described, these embodiments have been presented by way of example only, and are not intended to limit the scope of the disclosures. Indeed, the novel embodiments described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor storage device, comprising:
   a memory cell transistor;
   a word line connected to a gate of the memory cell transistor;
   a bit line connected to one end of the memory cell transistor;
   an input/output circuit through which an operation command is input;
   a controller configured to perform an operation on the memory cell transistor and to output a first signal upon receipt of the operation command;
   a first boosting circuit having a first output terminal and configured to output a first output voltage from the first output terminal upon receipt of the first signal;
   a first driver circuit having a drive terminal, connected to the first output terminal of the first boosting circuit, and configured to start outputting a drive signal from the drive terminal after being supplied with the first output voltage;
   a first driver transistor having a gate terminal connected to the drive terminal of the first driver circuit, a drain terminal connected to a power supply line, and a source terminal; and
   a second boosting circuit having a second output terminal, connected to the source terminal of the first driver transistor, and configured to output a second output voltage from the second output terminal,
   wherein a boosting capacity of the first boosting circuit is lower than a boosting capacity of the second boosting circuit, and
   wherein the second boosting circuit starts a boost operation after the first boosting circuit starts a boost operation.

2. The semiconductor storage device according to claim 1, wherein the first driver transistor is an N-type transistor and an enhancement type transistor.

3. The semiconductor storage device according to claim 1, wherein the first boosting circuit supplies the first output voltage to at least one other circuit that operates independently from the first driver circuit, the first driver transistor, and the second boosting circuit.

4. The semiconductor storage device according to claim 1, further comprising:
   a second driver transistor coupled between the power supply line and the first boosting circuit,
   wherein the second driver transistor is an N-type transistor and a depletion type transistor.

5. The semiconductor storage device according to claim 1, further comprising:
   a second driver transistor coupled between the power supply line and the first boosting circuit,
   wherein both of the first driver transistor and the second driver transistor are N-type transistors, and
   a threshold voltage of the first driver transistor is larger than a threshold voltage of the second driver transistor.

6. The semiconductor storage device according to claim 1, further comprising:
   a second driver transistor coupled between the power supply line and the first boosting circuit,
   wherein a second voltage is supplied to a source terminal of the second driver transistor when a voltage, which is the same as a power supply voltage supplied to the power supply line, is applied as a voltage between a gate terminal of the second driver transistor and the source terminal of the second driver transistor, and
   wherein a first voltage is supplied to the source terminal of the first driver transistor when a voltage, which is the same as the power supply voltage, is applied as a voltage between the gate terminal of the first driver transistor and the source terminal of the first driver transistor.

7. The semiconductor storage device according to claim 6, further comprising:
   an external pad configured to receive an external voltage,
   wherein the external voltage supplied from the external pad is supplied to the gate terminal of the second driver transistor.

8. The semiconductor storage device according to claim 7, wherein an area of the first boosting circuit is smaller than an area of the second boosting circuit.

9. A method of boosting a voltage in a semiconductor storage device, the semiconductor storage device including a memory cell transistor, a word line connected to a gate of the memory cell transistor, a bit line connected to one end of the memory cell transistor, an input/output circuit through which an operation command is input, a controller configured to perform an operation on the memory cell transistor, a first boosting circuit having a first output terminal, a first driver circuit having a drive terminal and connected to the first output terminal of the first boosting circuit, a first driver transistor having a gate terminal connected to the drive terminal of the first driver circuit, a drain terminal connected to a power supply line, and a source terminal, and a second boosting circuit having a second output terminal and connected to the source terminal of the first driver transistor, the method comprising:
   at the controller, upon receiving the operation command input through the input/output circuit, outputting a first signal to the first boosting circuit;
   at the first boosting circuit, upon receiving the first signal, outputting a first output voltage from the first output terminal;
   at the first driver circuit, starting to output a drive signal from the drive terminal after being supplied with the first output voltage from the first boosting circuit;
   controlling a voltage supplied to the source terminal of the first driver transistor in accordance with the drive signal output from the first driver circuit and applied to the gate terminal of the first driver transistor; and
   at the second boosting circuit, outputting a second output voltage from the second output terminal of the second boosting circuit based on the voltage supplied to the source terminal of the first driver transistor, wherein a boosting capacity of the first driver circuit is lower than a boosting capacity of the second boosting circuit, and wherein the second boosting circuit starts a boost operation after the first boosting circuit starts a boost operation.

10. The method according to claim 9, wherein the first driver transistor is an N-type transistor and an enhancement type transistor.

11. The method according to claim 9, further comprising:

supplying the first output voltage from the first boosting circuit to at least one other circuit that operates independently from the first driver circuit, the first driver transistor, and the second boosting circuit.

12. The method according to claim 9, wherein the semiconductor storage device includes a second driver transistor coupled between the power supply line and the first boosting circuit, wherein both of the first driver transistor and the second driver transistor are N-type transistors, and wherein a threshold voltage of the first driver transistor is larger than a threshold voltage of the second driver transistor.

13. The method according to claim 12, further comprising:

supplying an external voltage received at an external pad to a gate terminal of the second driver transistor.

14. The method according to claim 13, wherein an area of the first boosting circuit is smaller than an area of the second boosting circuit.

* * * * *